(12) United States Patent
Barnowski

(10) Patent No.: US 6,619,462 B2
(45) Date of Patent: Sep. 16, 2003

(54) DEVICE FOR CONVEYING PRINTED BOARDS

(75) Inventor: Frank Barnowski, München (DE)

(73) Assignee: Siemens Production and Logistics Systems AG, Nürnberg (DE)

( * ) Notice: Subject to any disclaimer, the term of this patent is extended or adjusted under 35 U.S.C. 154(b) by 0 days.

(21) Appl. No.: 10/239,061

(22) PCT Filed: Mar. 25, 2001

(86) PCT No.: PCT/DE01/01007
§ 371 (c)(1),
(2), (4) Date: Sep. 19, 2002

(87) PCT Pub. No.: WO01/72101
PCT Pub. Date: Sep. 27, 2001

(65) Prior Publication Data
US 2003/0047421 A1 Mar. 13, 2003

(30) Foreign Application Priority Data
May 22, 2000 (DE) .......................................... 100 14 199

(51) Int. Cl.[7] ............................................... B65G 37/00
(52) U.S. Cl. .................... 198/345.3; 118/324; 118/239; 198/465.3; 198/817
(58) Field of Search .............................. 198/817, 345.3, 198/465.3; 118/324, 239

(56) References Cited

U.S. PATENT DOCUMENTS

| | | | |
|---|---|---|---|
| 5,218,753 A | | 6/1993 | Suzuki et al. |
| 5,985,029 A | * | 11/1999 | Purcell ......................... 118/324 |
| 6,032,577 A | * | 3/2000 | Doyle .......................... 101/129 |
| 6,258,165 B1 | * | 7/2001 | Cavallaro .................... 118/323 |
| 6,307,386 B1 | * | 10/2001 | Fowler et al. .............. 324/754 |
| 6,374,729 B1 | * | 4/2002 | Doyle .......................... 101/114 |
| 6,409,159 B1 | * | 6/2002 | Asai et al. ................... 267/152 |

FOREIGN PATENT DOCUMENTS

| | | |
|---|---|---|
| EP | 0 491 539 A1 | 12/1991 |
| JP | 4-346299 | 12/1992 |

* cited by examiner

Primary Examiner—Christopher P. Ellis
Assistant Examiner—Richard Ridley
(74) Attorney, Agent, or Firm—Harness, Dickey & Pierce, P.L.C.

(57) ABSTRACT

A device is used for conveying printed board assemblies. Every segment of a conveyor line is provided, on both sides, with a conveyor cheek as the lateral border. Conveyor belts driven by wheels are mounted on the inner sides of the conveyor cheeks on vertically movable boards. On the upper edges of the conveyor cheeks, connector blocks are mounted on the inner side in the longitudinal direction. The connector blocks project beyond the movable boards in such a manner that, when the movable boards are lifted, the printed board is caught with its edge on both sides between the conveyor belt and the connector block.

18 Claims, 2 Drawing Sheets

DEVICE FOR CONVEYING PRINTED BOARDS

This application is the national phase under 35 U.S.C. §371 of PCT International Application No. PCT/DE01/01007 which has an International filing date of Mar. 15, 2001, which designated the United States of America and which claims priority on German Patent Application number DE 100 14 199.4 filed Mar. 22, 2000, the entire contents of which are hereby incorporated herein by reference.

FIELD OF THE INVENTION

The present invention generally relates to a device for conveying printed boards, especially in printed board assembly machines.

BACKGROUND OF THE INVENTION

In printed board assembly machines, substrates or printed boards that are fitted with semi-conductor chips or components are conveyed along a generally straight conveyor path. During the fitting operation, the printed board is clamped to hold it in place. Conveyance is accomplished using conveyor belts that are driven by suitable wheels or rollers. Only a narrow lateral strip of the substrate or printed board rests on the conveyor belts. The substrate or printed board is clamped down at a base or carrier element of the conveyor path. The conveyor path is divided into individual segments that follow each other in the direction of conveyance. Each segment has a driven conveyor belt and a clamping device for the printed boards.

SUMMARY OF THE INVENTION

An object of an embodiment of the present invention is to specify a device for conveying printed boards, especially for printed board assembly machines, in which the design effort is reduced compared to traditional conveyance devices.

In the device according to an embodiment of this invention, the conveyor path is formed by a base or carrier element on which or in which at least two segments, preferably a multiple of segments, are arranged, with each segment forming a section of the conveyor path. In each segment on both sides in relation to the direction of conveyance, there is a conveyor cheek that forms a lateral border. In each segment a conveyor belt driven by rollers or wheels is mounted on the side of the conveyor cheek facing the opposite conveyor cheek. These rollers along with the conveyor belts are located on movable plates, which may be moved on the inner side of the conveyor cheeks perpendicular to the direction of conveyance. Located on the top edges of the conveyor cheeks are connector blocks that are mounted on the inner side in the longitudinal direction and project beyond the movable plates in such a manner that, when the movable plates are raised, the edge of a printed board on either side is pinched between the conveyor belt and the connector blocks of the conveyor cheek. The conveyor cheeks can be adjusted transverse to the direction of conveyance so that the device may be adapted to the different widths of printed boards to be conveyed.

BRIEF DESCRIPTION OF THE DRAWINGS

In the following, the device according to exemplary embodiments of the invention is described in detail in relation to the attached FIGS. 1 to 3, which illustrate a preferred design, wherein.

DETAILED DESCRIPTION OF THE PREFERRED EMBODIMENTS

Figure 1:
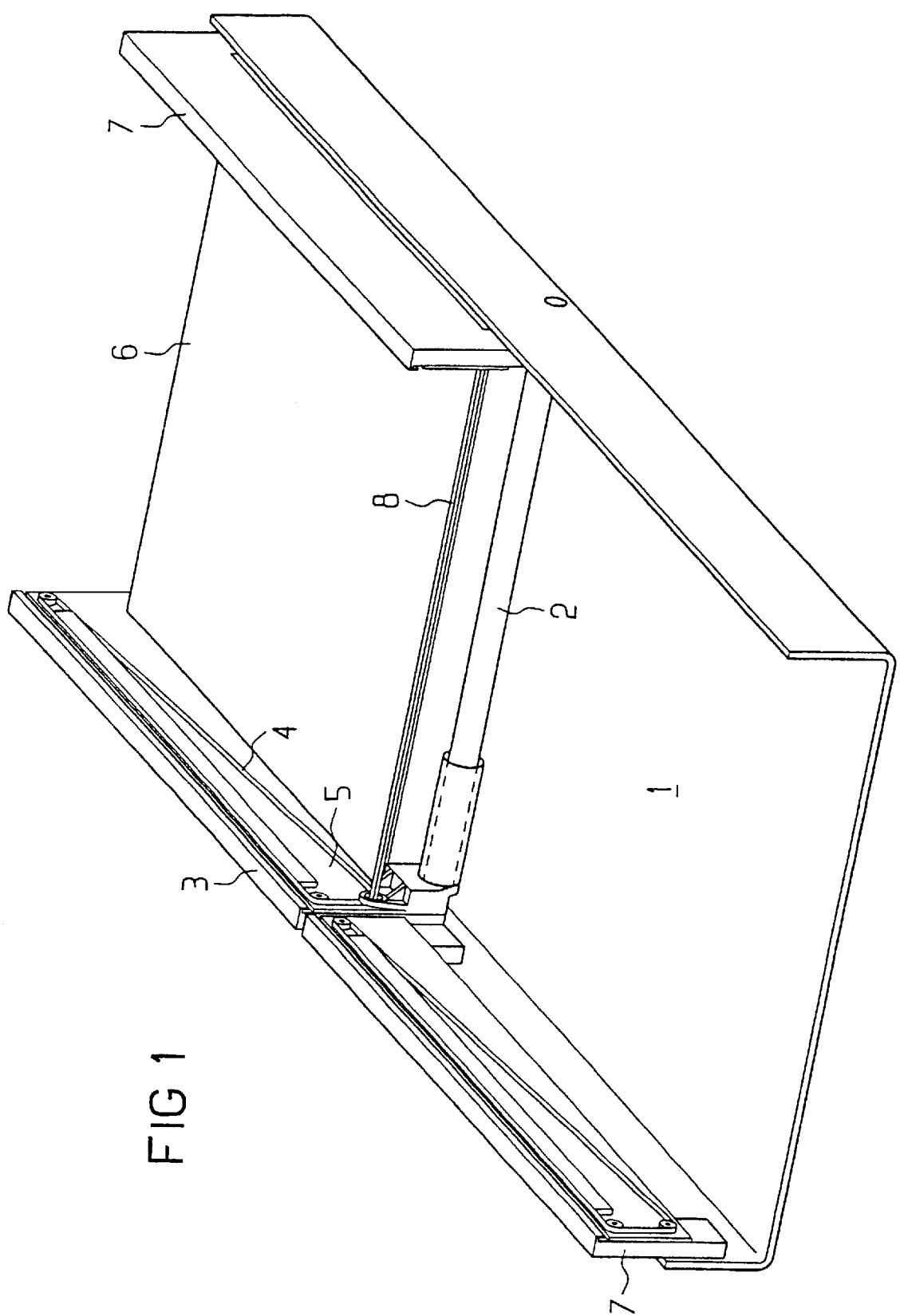
FIG. 1 Shows a section from the conveyor path according to an embodiment of the invention in an isometric view.

Depicted in FIG. 1 is a section of the conveyor path whose base is formed by a base and carrier element 1. The base and carrier element 1 in this example has a U-shaped cross-sectional profile, which is formed by an essentially flat base and two lateral parts attached thereto. Mounted on the inner side of the lateral parts are conveyor cheeks 7, which, in this exemplary design, each has a length in the direction of conveyance corresponding to a particular segment. Also possible is a design in which there is a conveyor cheek located on each side that belong together with all segments or at least one part of the segments. On the inner side, that is, the side facing the opposite conveyor cheek, a printed board is to be conveyed. Movable plates 5 are mounted in each segment on which conveyor belts 4, which are driven by rollers or wheels, are also disposed on the inner side. These rollers or wheels are mounted on movable plate 5 in such a manner that a portion of conveyor belt 4 runs essentially horizontally at the top edge of the movable plate. The top edges of each of inward-facing conveyor cheeks 7 are provided with connector blocks 3, which are aligned along the direction of conveyance and project beyond movable plates 5 to the extent that a consistent intermediate space is formed between connector blocks 3 and the horizontal top portion of each conveyor belt.

Movable plates 5 may be raised in the vertical direction via a mounted lifting device so that the intermediate space between connector block 3 and conveyor belts 4 is reduced enough to correspond to the thickness of an edge of a printed board to be conveyed. Preferably, provided as a lifting device, is an elevating platform 6 that may also be used to support the printed board. The edges of the printed board may be squeezed under connector blocks 3, thus in the upward direction, in such a manner that they can be stopped and it is possible to fit the board with components.

The conveyor belts are each preferably driven simultaneously for both conveyor cheeks of a segment, for example, by shaft 8 given in FIG. 1 (preferably, for example, a hexagonal shaft), at each end of which a wheel of the belt drive is mounted. It is insignificant whether shaft 8 is mounted concentrically to the drive wheel as the drive shaft or whether shaft 8 engages as a spline shaft on the periphery of a drive gear wheel. Shaft 8 is provided with a suitable drive unit (not shown). Shaft 8 may, for example, be driven by a drive motor present in each segment, or an appropriate transmission is mounted which is coupled, or may be coupled, to a central drive unit. Linear guide 2, which is mounted transversely to the direction of conveyance and is depicted in FIG. 1 without all of its details, so that the illustration is not too intricate, is used to move conveyor cheeks 7 transversely to the direction of conveyance in order to be able to alter the distance between them in accordance with the size of the printed boards to be conveyed.

Figure 2:
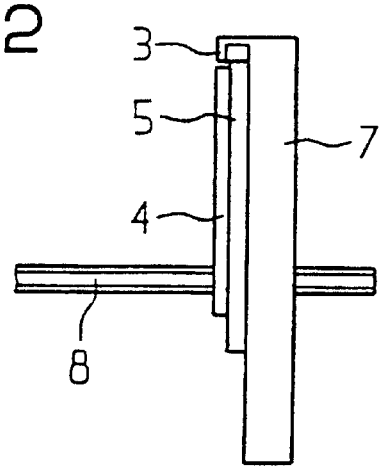
FIG. 2 Shows the arrangement of the movable plates on the conveyor cheek in cross-section.

Schematically depicted in cross section in FIG. 2 is the arrangement of movable plates 5 on conveyor cheeks 7. It is recognizable in FIG. 2 that connector block 3 on the inner side of conveyor cheek 7 preferably projects beyond movable plate 5 far enough that a sufficiently small distance between conveyor belt 4 and connector block 3 may be produced by a vertical upward movement of movable plate 5. It is also clear, with respect to FIG. 2, that the drive unit, represented here by shaft 8, must also be moved vertically together with plate 5. Since the drive must be moved together with movable plate 5 in relation to conveyor cheek 7, shaft 8 and any other components of the drive that may be present, are preferably situated in a floating arrangement in relation to conveyor cheek 7. Thus, the drive units are indeed mounted on the conveyor cheeks, but the mounting is such that the drive units may be moved together with movable plate 5.

The movable plate 5 is mounted, for example, via vertically arranged guide rails, similar, for example, to the connector blocks that are in the drawing on the conveyor cheek in question, in such a manner that it may be moved upward along conveyor cheek 7. The structural designs that can be installed for this purpose are technically known in and may be implemented using the measures and procedure known to the expert specializing in the field.

Figure 3:
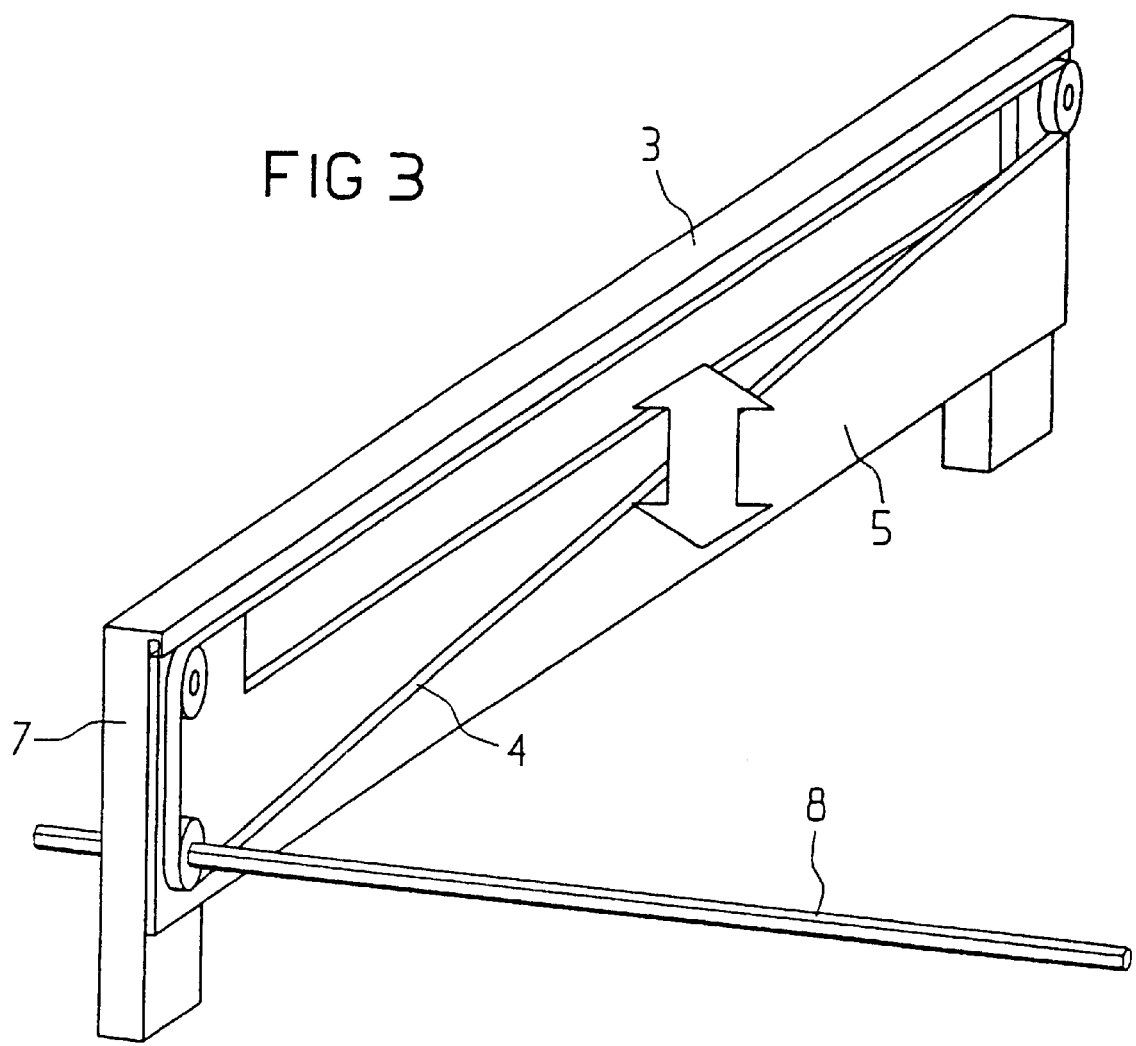
FIG. 3 Shows the arrangement of the movable plate along with the drive of the conveyor belt at the conveyor cheek in an isometric view.

FIG. 3 shows an isometric view of an individual conveyor cheek along with a movable plate 5 mounted on it. The double arrow in the drawing indicates that movable plate 5 may be moved upward or downward in relation to conveyor cheek 7. In this way, it is possible to adjust the intermediate space between the portion of conveyor belt 4 running horizontally between the two top wheels and connector block 3 mounted on conveyor cheek 7. A V-belt, flat belt, timing belt or round belt may be used as a conveyor belt, as is known in the specialty.

The possibility of adjusting the conveyor cheek transverse to the direction of conveyance via linear guide 2 shown in FIG. 1 may be configured in a variety of ways. In this way it may be provided that only the conveyor cheeks on one side are movable. Instead, the conveyor cheeks may be mounted in such a way that they may be moved inward or outward on both sides. The stopping of the conveyor cheeks may be affected by a clamping mechanism that is known in the specialty. The width of conveyor belt 4 is selected so that only the edge of the printed board that is usable for advance is covered. The disposition of the belt on the movable plate ensures that, in contrast to a conveyor mechanism that presses the printed boards on the conveyor belt from above, even extremely thin printed boards are not pinched between the belts and the pressing device. The device according to an embodiment of the invention may comprise a multiplicity of conveyor paths that are arranged next to each other and are each constructed of segments of the described type. In so doing, it may be provided that the width of the conveyor paths may be adjusted, jointly or independently of each other, by altering the distances between the conveyor cheeks.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for conveying printed boards, comprising:
    a base; and
    a multiplicity of segments, connected so as to follow each other in a given direction of conveyance, the segments including, on both sides in relation to the direction of conveyance,
    a conveyor cheek, in which rollers and a conveyor belt running around them, operate,
    a device for pressing the printed boards against the conveyor belts, including, on each side facing an opposing conveyor cheek, one connector block, each aligned in the direction of conveyance at an edge of the conveyor cheek,
    a vertically aligned movable plate, arranged on the conveyor cheek in each segment, wherein the rollers along with the conveyor belt are mounted on each movable plate, and
    a lifting device, provided for raising the movable plates toward the connector blocks, wherein the conveyor belts on the movable plates and the connector blocks on the conveyor cheeks are disposed in such a manner that, by raising the movable plates, an intermediate space is set between the conveyor belts and the connector blocks, said space being adjustable to correspond to a particular thickness on the edge of a printed board to be conveyed.

2. The device according to claim 1, wherein the lifting device comprises:
    elevating platforms present in each segment.

3. The device according to claim 1, wherein conveyor cheeks are present in each segment that have a length corresponding to the relevant segment in the direction of conveyance and include, transverse to the conveyor path, a linear guide with which the distance between the conveyor cheeks of the relevant segment is alterable with respect to each other.

4. The device according to claim 1, wherein the rollers mounted on each of the movable plates are driven via a shaft arranged transversely to the conveyor path, the shaft including a drive unit mounted thereto, and wherein the shaft and the drive unit drive each of the conveyor belts of two movable plates arranged opposite each other and being disposed in a floating arrangement in relation to the conveyor cheeks.

5. The device according to claim 2, wherein conveyor cheeks are present in each segment that have a length corresponding to the relevant segment in the direction of conveyance and including, transverse to the conveyor path, a linear guide with which the distance between the conveyor cheeks of the relevant segment is alterable with respect to each other.

6. The device according to claim 2, wherein the rollers mounted on each of the movable plates are driven via a shaft arranged transversely to the conveyor path, the shaft including a drive unit thereto, and wherein the shaft and the drive unit drive each of the conveyor belts of two movable plates arranged opposite each other and being disposed in a floating arrangement in relation to the conveyor cheeks.

7. The device according to claim 3, wherein the rollers mounted on each of the movable plates are driven via a shaft arranged transversely to the conveyor path, the shaft including a drive unit thereto, and wherein the shaft and the drive unit drive each of the conveyor belts of two movable plates arranged opposite each other and being disposed in a floating arrangement in relation to the conveyor cheeks.

8. A device for conveying printed boards, comprising:
    a base; and
    a plurality of segments of a conveyor line arranged on the base, each segment including a pair of conveyor cheeks, mounted on the base; and
    movable plates, arranged to operate on the conveyor cheek in each segment, including rollers and a conveyor belt mounted on each movable plate; and
    connector blocks, mounted on an inner side of the conveyor cheeks, wherein the connector blocks project beyond the movable plates in such a manner that, when the movable plates are adjusted, at least a portion of the printed board is caught between the conveyor belt and the connector block.

9. The device of claim 8, further comprising:

a lifting device for lifting the movable plates.

10. The device of claim 9, wherein the lifting device is adapted to lift the movable plates in a vertical direction so that an intermediate space between a connector block and a conveyor belts is reduced so as to correspond to a thickness of an edge of a printed board being conveyed.

11. The device of claim 9, wherein the lifting device includes an elevating platform to support the printed board.

12. The device of claim 10, wherein the lifting device includes an elevating platform to support the printed board.

13. The device of claim 9, wherein the lifting device is adapted to squeeze edges of the printed board under connector blocks.

14. The device of claim 10, wherein the lifting device is adapted to squeeze edges of the printed board under connector blocks.

15. The device of claim 1, wherein the base is U-shaped.

16. The device of claim 8, wherein the base is U-shaped.

17. The device according to claim 8, wherein the rollers mounted on each of the movable plates are driven via a shaft arranged transversely to the conveyor path, the shaft including a drive unit mounted thereto, and wherein the shaft and the drive unit drive each of the conveyor belts of two movable plates arranged opposite each other and wherein the shaft and movable plates are disposed in a floating arrangement in relation to the conveyor cheeks.

18. The device of claim 8, wherein the movable plate is movable in relation to a conveyor cheek, such that a space between a portion of conveyor belt between at least one roller and a connector block mounted on conveyor cheek is adjustable.

* * * * *